United States Patent
Friedrich et al.

(10) Patent No.: US 6,469,509 B2
(45) Date of Patent: Oct. 22, 2002

(54) INHERENTLY DECOUPLED MAGNETIC RESONANCE RECEPTION COIL ARRANGEMENT

(75) Inventors: Axel Friedrich, Nuremberg (DE); Helmut Greim, Adelsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/981,557

(22) Filed: Oct. 16, 2001

(65) Prior Publication Data
US 2002/0080911 A1 Jun. 27, 2002

(30) Foreign Application Priority Data
Oct. 16, 2000 (DE) .......................................... 100 51 155

(51) Int. Cl.[7] .................................................. G01V 3/00
(52) U.S. Cl. ........................ 324/318; 324/309; 324/322
(58) Field of Search ................................ 324/318, 322, 324/309, 307, 314, 319, 306, 300

(56) References Cited

U.S. PATENT DOCUMENTS

| | | | | |
|---|---|---|---|---|
| 4,918,388 A | * | 4/1990 | Mehdizadeh et al. | 324/322 |
| 5,243,287 A | | 9/1993 | Hashoian et al. | 324/318 |
| 5,274,332 A | * | 12/1993 | Jaskplski et al. | 324/318 |
| 5,510,711 A | * | 4/1996 | Mplyneaux et al. | 324/309 |
| 5,565,779 A | | 10/1996 | Arakawa et al. | 324/318 |
| 6,157,193 A | * | 12/2000 | Renz et al. | 324/318 |
| 6,377,044 B1 | * | 4/2002 | Burl et al. | 324/307 |

* cited by examiner

Primary Examiner—Edward Lefkowitz
Assistant Examiner—Brij B. Shrivastav
(74) Attorney, Agent, or Firm—Schiff Hardin & Waite

(57) ABSTRACT

An inherently decoupled MR reception coil arrangement for a magnetic resonance imaging tomography system has a number of selectively pluggable local coils, in which the local coils provided with active detuning also have a passive detuning circuit for the transmission phase, and at least one of the local coils has a passive detuning circuit for the reception phase in the unplugged state.

4 Claims, 1 Drawing Sheet

INHERENTLY DECOUPLED MAGNETIC RESONANCE RECEPTION COIL ARRANGEMENT

BACKGROUND OF THE INVENTION

1. Field of the Invention

The present invention relates to a receptive coil arrangement for magnetic resonance (MR) imaging tomography systems, of the type having a number of selectively pluggable local coils, in which at least some of local coils are active detuned and also have a passive detuning circuit for the transmission phase.

2. Description of the Prior Art

In magnetic resonance imaging tomography, RF coils (resonators) are used to pick up alternating magnetic fields. Optimization of the geometry and reception profile of the receptive coils for the various body regions is undertaken to ensure that a good signal to noise ratio is always obtained. To cover a relatively large body region, a number of local coils need to be positioned simultaneously on the patient.

The signal transmission from the coils to the reception system of the MR system is carried out via RF cables. When all the coils are plugged in, the inactive coils can be detuned by a suitable signal both during the transmission phase and during the reception phase, so as to prevent the reception quality of the active local coils from being compromised by fields being superimposed due to induced fields from the inactive coils. Since, however, the number of system terminals is limited, in most cases it is not possible for all the coils that are present on the patient table to be plugged in. If a coil is not plugged in, however, then the control signals required for possible detuning are absent. For the transmission phase, the coils generally have additional passive detuning, since in this case the signals are so strong that simple switching of corresponding components due to the received voltage is possible. During the reception phase, however an unplugged coil remains on resonance and can couple to a neighboring coil through magnetic fields, so that the coils are mutually influenced in such a way that the image quality becomes degraded.

SUMMARY OF THE INVENTION

It is an object of the present invention to configure a receptive coil arrangement, of the type mentioned above, so that unplugged coils cannot compromise the image quality at all, even during the reception phase.

This object is achieved in a magnetic reception coil arrangement of the type described above wherein, in accordance with the invention, at least some of the local coils are provided with a passive detuning circuit for the reception phase in the unplugged state.

While, during the transmission phase, the RF power infeed is so large that it is possible to activate the passive detuning circuit, which usually includes conducting diodes, the power level is not sufficient to switch the diodes during the reception phase. To that end, the invention includes a detuning circuit which can be designed particularly simply and expediently. In one embodiment of the invention, the determining circuit is a detuning resonant circuit having a detuning coil and a capacitor, which is in series with a reverse biased diode that becomes conducting when the coil is plugged in, this detuning resonant circuit being connected to the extraction RF cable of the local coil. The detuning coil is dimensioned so that it forms a high-impedance parallel circuit with the matching capacitances of the RF antenna tap, between the terminals thereof.

By this special configuration, in the case of an unplugged coil, the coil will be detuned due to the high-impedance parallel circuit at the terminals. If, however, the local coil is plugged back in, i.e. if it is actually to be utilized, then the diode becomes conducting and the detuning coil and the capacitor, which are in parallel with the diode (since it has become conducting), cooperate to form a parallel circuit. The detuning coil is therefore ineffective and the local coil remains on the resonance which has been set.

The passive detuning circuit for the transmission phase, which is applied to the RF takeoff points, can in the simplest case—as already indicated above—be formed by two oppositely biased diodes connected in parallel. Due to the high RF power fed in during the transmission phase, these diodes alternately become conducting and therefore short-circuit the extraction capacitance of the local coil.

In an embodiment of the invention, the passive detuning circuit for the transmission phase may be integrated into the passive detuning circuit according to the invention for the reception phase. To that end, according to the invention, a second, oppositely biased diode can be connected in series with the diode of the detuning resonant circuit, with the tap for the activation signal when plugging in the local coil lying between these diodes. Owing to the opposite polarity connection of these two diodes, the detuning is effective even during the transmission phase, i.e. when the coil is not plugged in, since one of these diodes always becomes conducting due to the high applied RF transmission power. The conventional passive detuning for the transmission phase therefore becomes superfluous. The passive detuning circuit according to the invention for the reception phase also operates during the transmission phase.

DESCRIPTION OF THE PREFERRED EMBODIMENTS

The signal transmission from the reception coil S to the reception system of the magnetic resonance system is carried out through an RF cable K, which is connected via matching capacitances Cs and Cp to the antenna tap points (terminals) A and B. AV is a customary active detuning arrangement, which can be given a signal for activating the active detuning via the terminal point DC 2. The capacitors Cp and Cs are configured so that matching for a 50-ohm output can be achieved therewith. A capacitor CF is used for frequency matching of the receive coil S. Two oppositely biased diodes D2 and D3, which form a passive detuning circuit for the transmission phase, are connected in parallel with the capacitor Cp. During the transmission phase, the RF power that is fed in is so large that the diodes D2 and D3 become conducting and therefore interrupt the resonant current in the coil flow path, in order to avoid interfering with the exciting field B1 during the transmission phase. In order to avoid interfering with a neighboring coil even during the reception phase in the case of an unplugged coil S, the coil S has a passive detuning circuit which is effective even with very small signals. This detuning circuit is formed of a detuning resonant circuit VS having a detuning coil Lv and a capacitor Cv, with which a diode D1 is connected in series.

If the coil S is not plugged in, then the diode D1 presents a high impedance. The inductor LV is therefore in series with the capacitor Cs and in parallel with the capacitor Cp, their values being selected so that they form a high-impedance parallel circuit at the operating frequency between the points A and B. The coil S is hence detuned in the unplugged state. If the coil S is plugged in, then the diode D1 becomes conducting and Lv and Cv cooperate to form a parallel resonant circuit. Its apparent impedances are gone and the detuning coil Lv is therefore ineffective.

Figure 1:
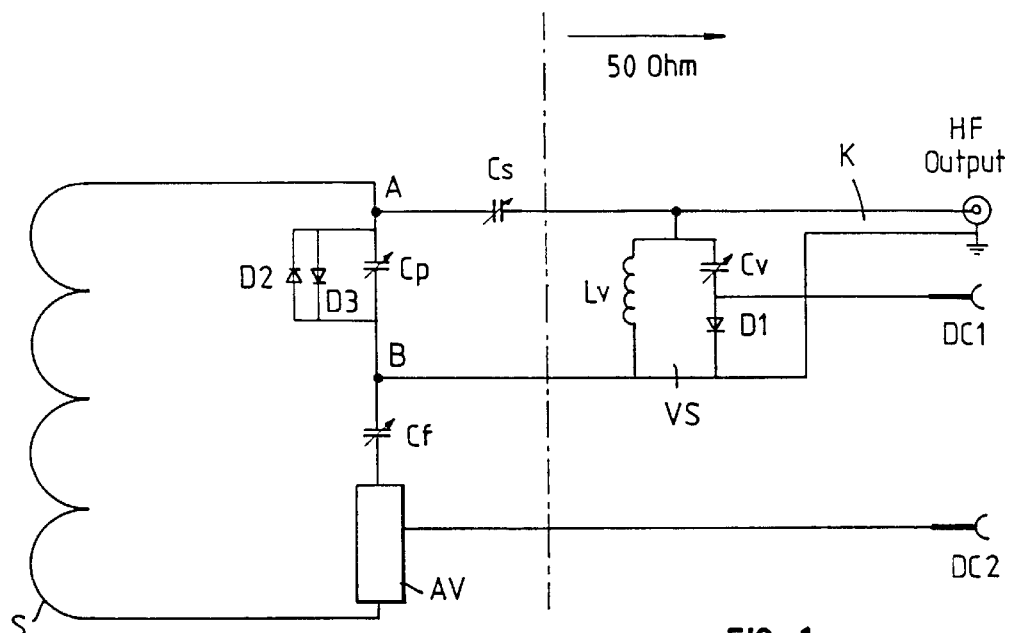
FIG. 1 is a circuit diagram of an MR receptive coil having a connected RF cable and separate passive detuning circuits for the transmission phase and the reception phase in accordance with the invention.
Figure 2:
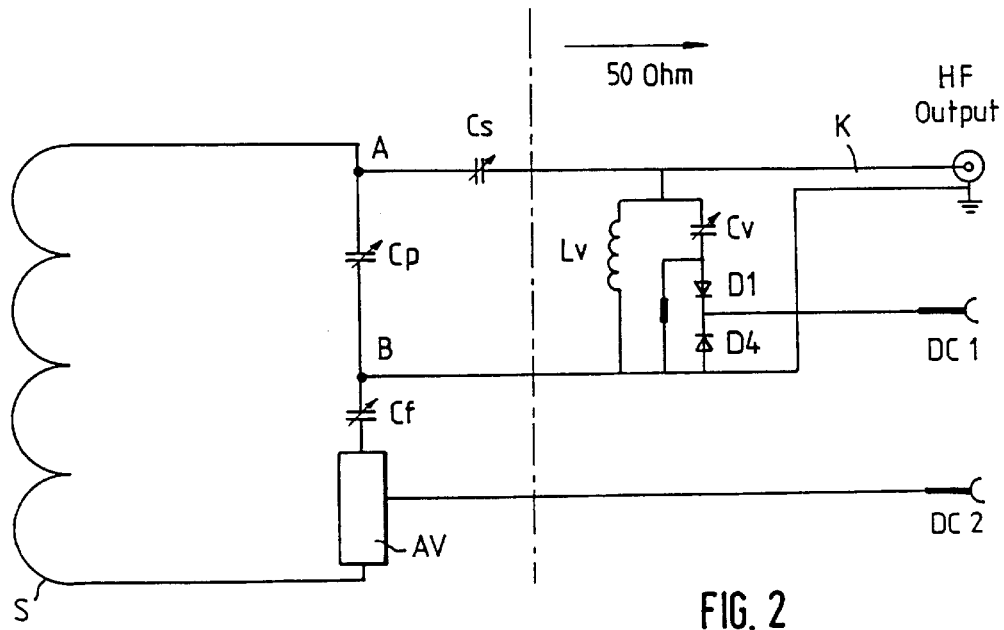
FIG. 2 is a circuit diagram reception coil arrangement, corresponding basically to that of FIG. 1, in which the passive detuning circuit according to the invention for the reception phase is effective even during the transmission phase.

In the exemplary embodiment according to FIG. 2, the passive detuning circuit for the transmission phase, as formed by the diodes D2 and D3 in FIG. 1, is not present. Instead, a second diode D4 with opposite polarity is connected in series with the diode D1 of the detuning resonant circuit VS, the terminal DC 1 for activating the reception coil in the plugged state being located between these two diodes D1 and D4. The diodes D1 and D4 in FIG. 2 assume the role of the diodes D2 and D3 in the exemplary embodiment according to FIG. 1.

Although modifications and changes may be suggested by those skilled in the art, it is the intention of the inventors to embody within the patent warranted hereon all changes and modifications as reasonably and properly come within the scope of their contribution to the art.

We claim as our invention:

1. A reception coil arrangement for a magnetic resonance tomography system operable in a transmission phase and in a reception phase, said reception coil arrangement comprising:

a plurality of selectively pluggable local coils;

an active detuning arrangement for actively detuning selected local coils in said plurality of local coils, each of said local coils having a passive detuning circuit for said transmission phase; and at least some local coils in said plurality of local coils having a passive detuning circuit for the reception phase, when said at least some local coils are in an unplugged state.

2. A reception coil arrangement as claimed in claim 1 further comprising a plurality of RF cables respectively for said local coils in said plurality of local coils, said RF cable being connected to a respective local coil at two terminals respectively having matching capacitances associated therewith; and wherein said passive detuning circuit comprises a detuning coil and a capacitor connected in series with a reverse-biased diode, said reverse-biased diode becoming conducting when the local coil in which it is disposed is plugged in, said detuning resonant circuit being connected to said RF cable, and said detuning coil being dimensioned to form a high-impedance parallel circuit with said matching capacitances.

3. A reception coil arrangement as claimed in claim 2 wherein said passive detuning circuit for the transmission phase is connected at said terminals and is formed by two oppositely biased diodes connected in parallel.

4. A reception coil arrangement as claimed in claim 2 wherein said detuning resonant circuit further comprises a further diode, biased oppositely to said reversed biased diode, connected in series with said reversed biased diode, and further comprising a terminal for receiving an activation signal for activating said active detuning, when the local coil is plugged in, disposed between said further diode and said reversed biased diode.

* * * * *